(12) United States Patent
Kim et al.

(10) Patent No.: US 8,253,034 B2
(45) Date of Patent: Aug. 28, 2012

(54) PRINTED CIRCUIT BOARD AND SEMICONDUCTOR PACKAGE WITH THE SAME

(75) Inventors: Byoung Chan Kim, Cheongiu-si (KR); Young Hwan Shin, Daejeon (KR); Chin Kwan Kim, Daejeon (KR); Dong Won Kim, Daejeon (KR); Kui Won Kang, Cheongiu-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/926,337

(22) Filed: Nov. 10, 2010

(65) Prior Publication Data
US 2011/0286191 A1  Nov. 24, 2011

(30) Foreign Application Priority Data
May 24, 2010 (KR) .................. 10-2010-0047975

(51) Int. Cl.
*H05K 1/11* (2006.01)
*H05K 1/18* (2006.01)
*H05K 7/10* (2006.01)

(52) U.S. Cl. ......... 174/262; 174/265; 361/761; 361/767

(58) Field of Classification Search .................. 361/783, 361/761, 767; 257/787–796, 778, 687, E21.503, 257/698, 700; 174/255, 260, 262, 265
See application file for complete search history.

(56) References Cited

U.S. PATENT DOCUMENTS

| 5,218,234 | A | * | 6/1993 | Thompson et al. | ............ 257/787 |
| 5,737,191 | A | * | 4/1998 | Horiuchi et al. | ............. 361/764 |
| 6,153,930 | A | * | 11/2000 | Hori | .............................. 257/687 |
| 6,248,951 | B1 | * | 6/2001 | Murali et al. | .................. 174/521 |
| 6,291,264 | B1 | * | 9/2001 | Tang et al. | ...................... 438/106 |
| 6,320,127 | B1 | * | 11/2001 | Nagarajan et al. | ............. 174/557 |
| 6,707,162 | B1 | * | 3/2004 | Ho et al. | ........................ 257/778 |
| 6,844,052 | B2 | * | 1/2005 | Jiang | .............................. 428/209 |
| 7,099,525 | B2 | * | 8/2006 | Bakir et al. | ....................... 385/14 |
| 2003/0194833 | A1 | * | 10/2003 | Quinones et al. | ............. 438/108 |
| 2005/0121310 | A1 | * | 6/2005 | Yamada et al. | .......... 204/192.12 |
| 2005/0206017 | A1 | * | 9/2005 | Starkston et al. | ............. 257/797 |

(Continued)

FOREIGN PATENT DOCUMENTS

| JP | 11-150206 | 6/1999 |
| KR | 10-2001-0019260 | 3/2001 |
| KR | 10-2009-0108777 | 10/2009 |
| KR | 10-2010-0053307 | 5/2010 |

OTHER PUBLICATIONS

Korean Notice of Allowance issued Aug. 18, 2011 in corresponding Korean Patent Application 10-2010-0047975.

*Primary Examiner* — Timothy Thompson
*Assistant Examiner* — Sherman Ng

(57) ABSTRACT

Disclosed herein is a printed circuit board. The printed circuit board includes a base substrate including a first region on which a semiconductor chip is mounted and a second region positioned outside the first region, first insulating patterns covering the base substrate and including trenches formed on the second region, and second insulating patterns protruding from the first insulating patterns on the second region. The trench and the second insulating pattern may be used as a structure defining an underfill forming material in a preset shape during the process of forming an underfill.

14 Claims, 4 Drawing Sheets

U.S. PATENT DOCUMENTS

| | | |
|---|---|---|
| 2006/0043570 A1* | 3/2006 | Muramatsu et al. .......... 257/698 |
| 2006/0081976 A1* | 4/2006 | Patel ............................. 257/697 |
| 2008/0174025 A1* | 7/2008 | Ryu et al. ...................... 257/773 |
| 2008/0237883 A1* | 10/2008 | Tago et al. .................... 257/774 |
| 2009/0001606 A1* | 1/2009 | Tamadate ...................... 257/778 |
| 2009/0072404 A1* | 3/2009 | Kikuchi et al. ................ 257/753 |
| 2009/0294162 A1* | 12/2009 | Jeong et al. .................... 174/260 |
| 2011/0042797 A1* | 2/2011 | Park et al. ..................... 257/690 |

* cited by examiner

[FIG. 1]
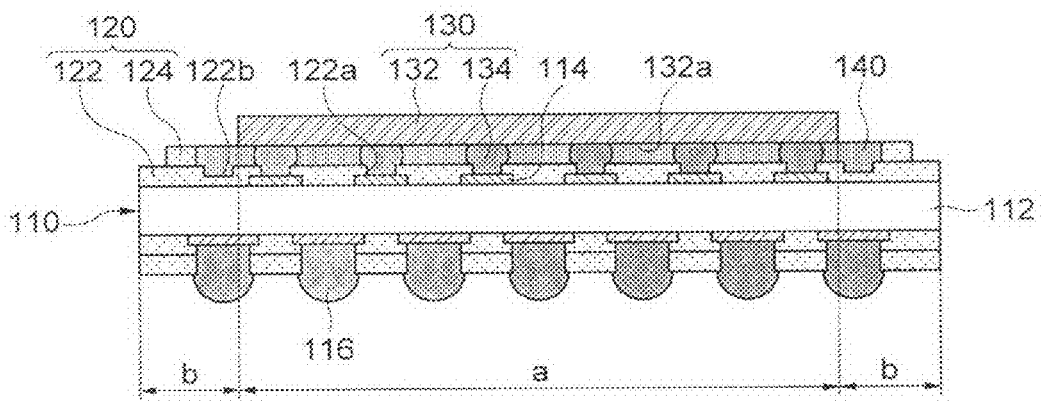
[FIG. 2]
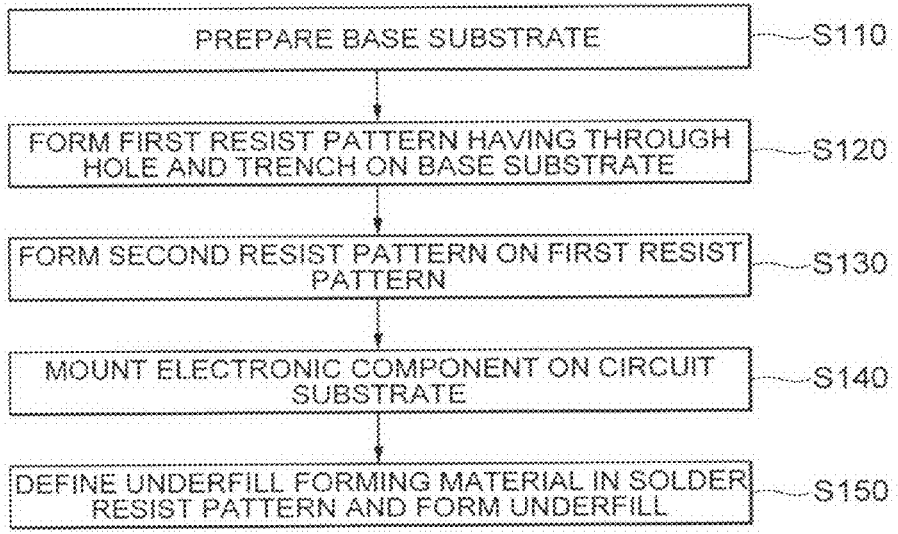

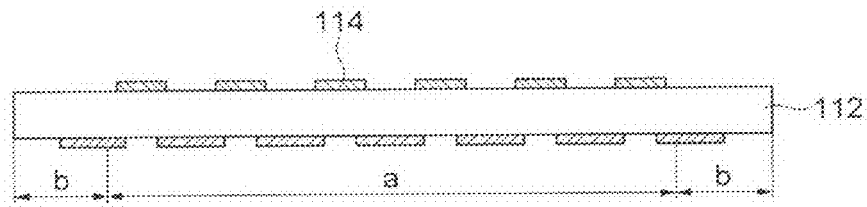
[FIG. 3A]
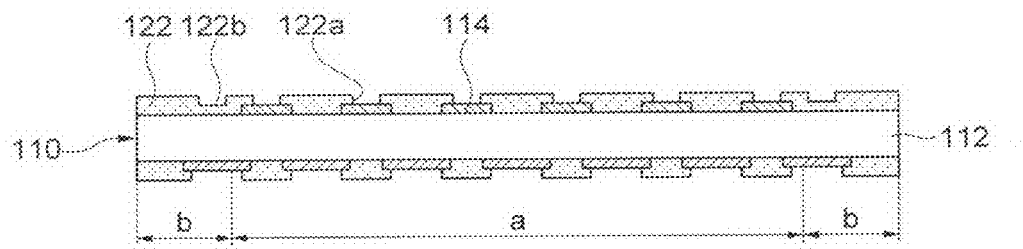
[FIG. 3B]
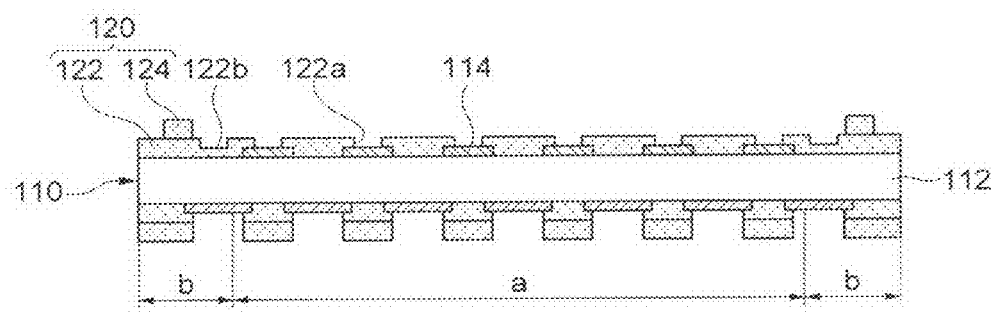
[FIG. 3C]
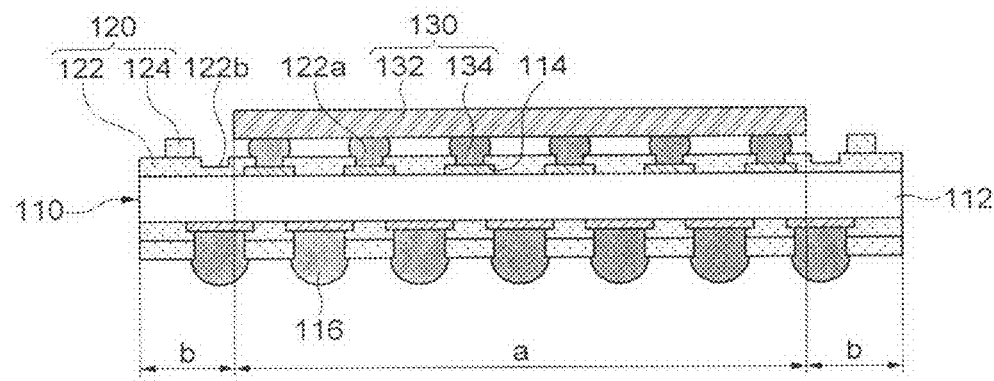
[FIG. 3D]

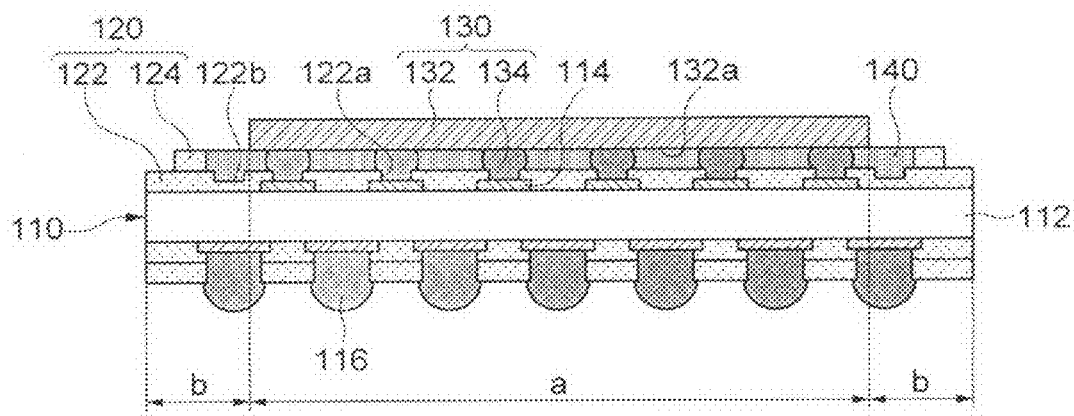
[FIG. 3B]
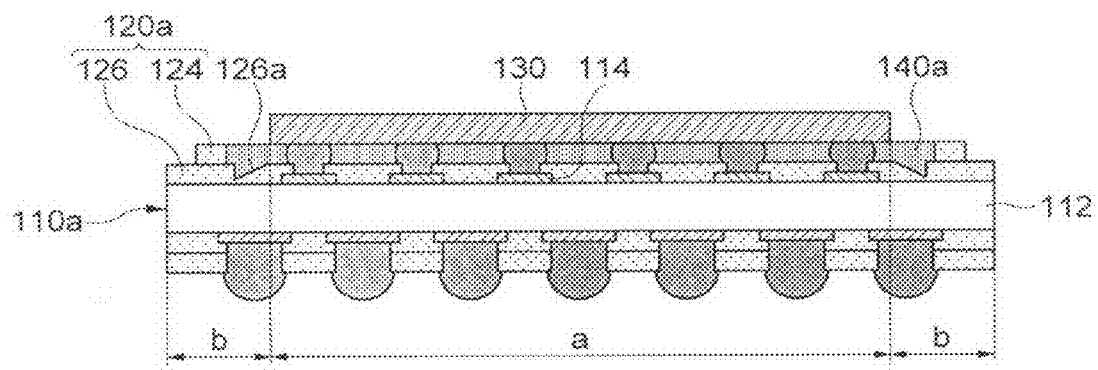
[FIG. 4]

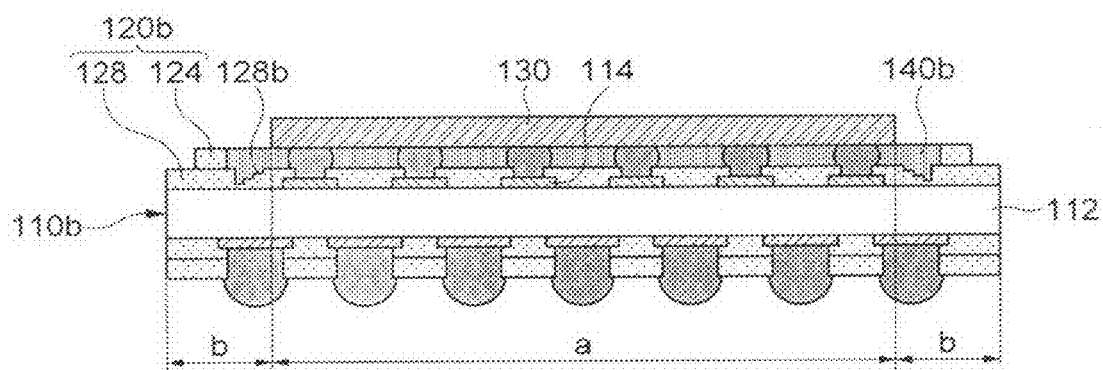

PRINTED CIRCUIT BOARD AND SEMICONDUCTOR PACKAGE WITH THE SAME

CROSS REFERENCE TO RELATED APPLICATION

This application claims the benefit of Korean Patent Application No. 10-2010-0047975, filed on May 24, 2010, entitled "Printed Circuit Board And Semiconductor Package With The Same", which is hereby incorporated by reference in its entirety into this application.

BACKGROUND OF THE INVENTION

1. Technical Field

The present invention relates to a printed circuit board and a semiconductor package with the same, and more particularly, to a printed circuit board that improves reliability in forming an underfill and a semiconductor package with the same.

2. Description of the Related Art

A semiconductor package technology is provided in order to protect manufactured semiconductor chips (IC) from the external environment and mount the semiconductor chips on external electronic apparatuses. In general, the semiconductor package has a structure in which a circuit substrate such as a printed circuit board (PCB) and a semiconductor chip mounted on a first region of the circuit substrate are provided. In addition, an underfill may be provided between the circuit substrate and the semiconductor chip. The underfill may reinforce bonding reliability of the semiconductor package which may be lowered due to a difference in thermal expansion coefficient between the circuit substrate and the semiconductor chip and protect a connection solder from external environment.

Due to high integration of a semiconductor package, an interval between the circuit substrate and the semiconductor chip has recently been reduced and thus, there is a demand for a technique for forming the underfill accurately and effectively. When the interval between the circuit substrate and the semiconductor chip is extremely reduced, however, it is difficult to accurately form the underfill in the first region of the circuit substrate, causing a phenomenon that the underfill is deviated from the interval between the circuit substrate and the semiconductor chip.

SUMMARY OF THE INVENTION

An object of the present invention is to provide a printed circuit board having a structure capable of improving the efficiency of forming an underfill.

An object of the present invention is to provide a semiconductor package capable of improving the efficiency of forming an underfill.

According to an exemplary embodiment of the present invention, there is provided a printed circuit board including: a base substrate including a first region on which a semiconductor chip is mounted and second regions positioned outside the first region, first insulating patterns covering the base substrate and including trenches formed on the second regions, and second insulating patterns protruding from the first insulating patterns on the second regions.

The trench may have an inclined structure in which its depth becomes deeper as being far from the first region.

The trench may have a step structure in which its depth becomes deeper as being far from the first region.

The trench may have a ring shape surrounding the semiconductor chip.

The second insulating pattern may have a ring shape surrounding the trench.

The first insulating pattern and the second insulating pattern may form a solder resist pattern.

The first insulating pattern may be made of a solder resist and the second insulating pattern may be made of an epoxy resin.

According to an exemplary embodiment of the present invention, there is provided a semiconductor package, including: a semiconductor chip; a base substrate including a first region on which the semiconductor chip is mounted and a second region positioned outside the first region; an underfill interposed between the base substrate and the semiconductor chip; first insulating patterns covering the base substrate and including trenches formed on the second region; and second insulating patterns protruding from the first insulating patterns on the second region.

The first insulating pattern and the second insulating pattern may form a structure defining the underfill in a preset shape.

The trench may have an inclined structure in which its depth becomes deeper as being far from the first region.

The trench may have a step structure in which its depth becomes deeper as being far from the first region.

The trench may have a ring shape surrounding the semiconductor chip.

The second insulating pattern may have a ring shape surrounding the trench.

The second insulating pattern may have a shape surrounding the side surfaces of the underfill.

BRIEF DESCRIPTION OF THE DRAWINGS

FIG. 1 is a diagram showing a semiconductor package according to an embodiment of the present invention;

FIG. 2 is a flow chart showing a method of manufacturing a semiconductor package according to an embodiment of the present invention;

FIGS. 3A to 3E are diagrams for explaining a manufacturing process of a semiconductor package according to an embodiment of the present invention;

FIG. 4 is a diagram showing one modified example of the semiconductor package of FIG. 1; and FIG. 5 is a diagram showing the other modified example of the semiconductor package of FIG. 1.

DESCRIPTION OF THE PREFERRED EMBODIMENTS

Various advantages and features of the present invention and methods accomplishing thereof will become apparent from the following description of embodiments with reference to the accompanying drawings. However, the present invention may be modified in many different forms and it should not be limited to the embodiments set forth herein. Rather, these embodiments may be provided so that this disclosure will be thorough and complete, and will fully convey the scope of the invention to those skilled in the art. Like reference numerals in the drawings denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Hereinafter, a printed circuit board and a semiconductor package with the same according to embodiments of the present invention will be described in detail with reference to the accompanying drawings.

FIG. 1 is a diagram showing a semiconductor package according to an embodiment of the present invention. Referring to FIG. 1, a semiconductor package 100 may include an electronic component 130 and a circuit substrate 110 bonded to each other by interposing an underfill 140 therebetween. The circuit substrate 110 may be a printed circuit board (PCB).

The circuit substrate 110 may be a substrate having circuit wirings receiving an electrical signal from the electronic component 130. As an example, the circuit substrate 110 may include a base substrate 112 having a structure in which a plurality of ceramic green sheets are stacked. The base substrate 112 may include internal circuit wirings, conductive vias selectively connected to the internal circuit wirings, and external circuit wirings 114 electrically connected to the internal circuit wirings and the conductive vias. The circuit substrate 110 may further include external connection terminals 116 that electrically connect the circuit substrate 110 to an external electronic apparatus (not shown).

The circuit substrate 110 may include a first region a on which the electronic component 130 is mounted and second regions b on which the electronic component 130 is not mounted, while being disposed outside the first region a. The first region a may be positioned substantially at the center of the circuit substrate 110 and the second regions b may be positioned at the edges surrounding the center thereof. Therefore, the first region a may have a shape substantially corresponding to the shape of the electronic component 130, and the second regions b may have a ring shape surrounding the first region a. Herein, the first region a and the second regions b are optionally divided on the basis of the edges of the electronic component 130 and the interface between the first region a and the second regions b may not be limited to the edges of the electronic component 130. For example, the first region a may include a partial region not directly opposite to the electronic component 130.

The electronic component 130 may include a semiconductor chip 132 and connection solders 134. The semiconductor chip 132 may have a bonding surface 132a opposite to the first region a of the circuit substrate 110. The bonding surface 132a may be provided with the plurality of connection solders 134. Herein, a general semiconductor chip has a quadrangular plate structure, such that the first region a may have substantially a quadrangular shape and the second regions b may have the quadrangular ring shape surrounding the first region a.

Meanwhile, the circuit substrate 110 may have solder resist patterns 120 covering the base substrate 112. The solder resist patterns 120 may include first insulating patterns 122 covering the base substrate 112 and second insulating patterns 124 cover the first insulating patterns 122.

The first insulating patterns 122 may include through holes 122a formed in the first region a and trenches 122b formed on the second regions b. The through holes 122a may selectively expose the external circuit wirings 114 of the base substrate 112. The trenches 122b may have a ring shape surrounding the semiconductor chip 132. For example, when the semiconductor chip 132 has a quadrangular plate shape, the trench 122b may have a quadrangular ring shape.

The second insulating patterns 124 may be disposed outside the trench 122b on the second regions b. The second insulating patterns 124 may have a shape protruding upward from the first insulating patterns 122. In addition, the second insulating patterns 124 may have a ring shape surrounding the trench 122b outside the trench 122b. Further, the second insulating patterns 124 may be configured to surround the side surfaces of the underfill 140.

The solder resist patterns 120 having the structure as described above may have a multi-layer structure in which the first insulating patterns 122 and the second insulating patterns 124 are stacked on the base substrate 112. In addition, the solder resist pattern 120 may have a structure in which the trench 122b and the second insulating pattern 124 have a step. The structure with a step may be provided as a structure in order to prevent a material for forming the underfill 140 from being deviated from the first region a during the process of forming the underfill 140. A process of forming the underfill 140 by the solder resist pattern 120 will be described in detail.

Meanwhile, even though the present embodiment describes the case in which the first insulating pattern 122 and the second insulating pattern 124 are made of a solder resist material by way of example, the material of the first and the second insulating patterns 122 and 124 may be variously changed. For example, the material of the first insulating pattern 122 may be different from that of the second insulating pattern 124. As an example, the first insulating pattern 122 may be made of a solder resist and the second insulating pattern 124 may be made of an epoxy resin.

As described above, the semiconductor package 100 according to the embodiment of the present invention may be configured to include the circuit substrate 110 having the first region a and the second regions b and the external circuit wirings 114 formed thereon, and the solder resist pattern 120 having the first insulating patterns 122 with the trenches 122b and the second insulating patterns 124 to have a step structure. Herein, the step structure formed of the trenches 122b and the second insulating patterns 124 may be used as a structure that accurately forms the underfill 140 in the first region a by limiting it to the first region a. Therefore, the semiconductor package 100 as described above may have a structure capable of improving reliability in forming the underfill 140.

Continuously, a method of manufacturing a semiconductor package according to an embodiment of the present invention described above will be described in detail. Herein, a description overlapping with the semiconductor package 100 described above will be omitted or simplified.

FIG. 2 is a flow chart showing a method of manufacturing a semiconductor package according to an embodiment of the present invention, and FIGS. 3A to 3E are diagrams for explaining a manufacturing process of a semiconductor package according to an embodiment of the present invention.

Referring to FIGS. 2 and 3A, the base substrate 112 may be prepared (S110). For example, the preparing the base substrate 112 may include manufacturing a ceramic substrate laminate, and forming a conductive via and an external circuit wiring 114 electrically connected to the conductive via (not shown) on the ceramic substrate laminate. Meanwhile, the base substrate 112 may include the first region a and the second region b.

Referring to FIGS. 2 and 3B, the first insulating pattern 122 including the through hole 122a and the trench 122b may be formed on the base substrate 112 (S120). For example, the forming the first insulating pattern 122 may include forming a first resist film covering the base substrate 112 and forming the through hole 122a and the trench 122b on the first resist film. The forming the through hole 122a may include performing a photolithography process exposing the external circuit wiring 114 of the base substrate 112 on the first resist film on the first region a. The forming the trench 122b may include performing any one of a laser processing and a drilling process on the first resist film on the second region b. The trench 122b may be formed to have a ring shape surrounding the first region a.

Referring to FIGS. 2 and 3C, the second insulating pattern 124 may be formed on the first insulating pattern 122 (S130). As an example, the forming the second insulating pattern 124 may include forming a second resist film covering the first insulating pattern 122 and removing the second resist film of other regions except for the ring-shaped region surrounding the trench 122b, for the second resist film on the second region b. In addition, the removing the second resist film may include exposing the external circuit wiring 114 of the circuit substrate 110. Therefore, the second insulating pattern 124 protruding upward from the first insulating pattern 122 and having a ring shape surrounding the trench 122b may be formed on the first insulating pattern 122 of the second region b. Through the process as described above, it is possible to manufacture the circuit substrate 110 including the base substrate 112 and the solder resist patterns 120 having a structure in which the first and second insulating patterns 122 and 124 are stacked on the base substrate 112 in sequence.

Meanwhile, even though the embodiment describes the case in which the second insulating patterns 124 are formed by performing the photolithography process on the resist film by way of example, the process of forming the second insulating pattern 124 may be variously changed. As another example, the second insulating pattern 124 may be made of an epoxy resin and in this case, the second insulating pattern 124 may be formed by applying the epoxy resin on the first insulating pattern 122 by an ink-jet printing method.

Referring to FIGS. 2 and 3D, the electronic component 130 may be mounted on the circuit substrate 110 (S140). For example, the mounting the electronic component 130 may include preparing the semiconductor chip 132 having the bonding surface 132a on which the connection solders 134 are formed, positioning the semiconductor chip 132 so that the connection solders 134 are positioned on the exposed external circuit wirings 114 by the through holes 122a, and bonding the connection solders 134 to the external circuit wirings 114. Therefore, the circuit substrate 110 and the semiconductor chip 132 may be bonded to each other.

Referring to FIGS. 2 and 3E, the underfill 140 may be formed by limiting the underfill forming material to the first region a by the solder resist patterns 120 (S150). For example, the forming the underfill 132 may include injecting the underfill forming material between the circuit substrate 110 and the electronic component 130. Herein, the underfill forming material may be prevented from being extended to the second region b from the first region a by the trench 122b of the first insulating pattern 122 and the second insulating pattern 124. More specifically, the underfill forming material injected into the first region a may be first prevented from being primarily extended to the second region b by the trench 122b. At this time, the portions of the underfill forming material, of which extension is not prevented by the trench 122b, may be prevented from being secondarily extended to the second region b by the second insulating pattern 124. Thereafter, the underfill forming material is cured, thereby making it possible to form the underfill 140 on the first region a. Therefore, it is possible to manufacture the semiconductor package 100 in which the width of the underfill 140 is accurately defined in the first region a between the circuit substrate 110 and the electronic component 130 by the solder resist patterns 120.

Herein, the embodiment describes the case in which the circuit substrate 110 is bonded to the electronic component 130 and then the underfill forming material is injected between the circuit substrate 110 and the electronic component 130, thereby forming the underfill 140, by way of example. However, before bonding the electronic components 130 to the circuit substrate 110, the underfill forming material is applied to the circuit substrate 110 and the electronic component 130 is positioned on the circuit substrate 110 and the underfill forming material is then cured, thereby making it also possible to form the underfill 140.

As described above, the method of manufacturing a semiconductor package according to the embodiment of the present invention may include preparing a base substrate 112 including the first region a and the second region b, forming the solder resist patterns 120 having a structure in which the first insulating patterns 122 having the trenches 122b and the second insulating patterns 124 are stacked on the base substrate 112, and forming the underfill 140 between the circuit substrate 110 and the electronic component 130, while defining the underfill forming material in the first region a by the solder resist patterns 120. Therefore, the method of manufacturing a semiconductor package according to the present invention can accurately form the underfill 140 by defining it in the preset region, thereby making it possible to improve reliability in forming the underfill 140 of the semiconductor package 100.

Hereinafter, the modified examples of the semiconductor package 100 described above will be described in detail. Herein, a description overlapping with the semiconductor package 100 as described above may be omitted or simplified.

FIG. 4 is a diagram showing one modified example of the semiconductor package of FIG. 1. Referring to FIG. 4, a semiconductor package 100a according to one modified example of the present invention includes a circuit substrate 110a and an electronic component 130 bonded to each other, and an underfill 140a formed between the circuit substrate 110a and the electronic component 130, wherein the circuit substrate 110a includes a base substrate 112 having external circuit wirings 114, first insulating patterns 126 covering the base substrate 112 so that the external circuit wirings 114 are exposed, and second insulating patterns 124 covering the first insulating patterns 126.

The first insulating patterns 126 may include a trench 126a surrounding the electronic component 130 and having an inclined structure in which its depth becomes deeper as being far from the first region a. In other words, the trench 126a may have an inclined structure in which its depth gradually becomes deeper as being closer to the second region b, as compared to the trench 122b described with reference to FIG. 1.

Meanwhile, the first insulating patterns 126 having the trench 126a may be formed by performing a predetermined photolithography process. As an example, the forming the first insulating pattern 126 may include forming a first resist film covering the base substrate 112, and performing a photolithography process having a process condition in which etching intensity is higher as being far from the first region a, on the second region b of the first resist film. In order to increase etching intensity as being far from the first region a, the photolithography process may include an exposure process having a condition in which light intensity emitted on the region in which the trench 126a is formed becomes larger as being far from the first region a. Alternatively, for the region in which the trench 126a is formed, the photolithography process may include a wet etching process having a condition in which the etch rate becomes larger as being far from the first region a.

The trench 126a having the structure as described above may have a structure in which the underfill forming material is easily introduced during the process of forming the underfill 140a, as compared to the trench 122b described with reference to FIG. 1. That is, the trench 126a has an inclined structure, such that the underfill forming material introduced into the first region a to be flowed to the second region b may be easily introduced into the trench 126a. Therefore, the semiconductor package 100a allows the underfill forming material to be effectively defined in the first region a, thereby making it possible to prevent voids in the underfill 140a from being generated and precisely form the underfill 140a.

FIG. 5 is a diagram showing the other modified example of the semiconductor package of FIG. 1. Referring to FIG. 5, a semiconductor package 100b according to the other modified example of the present invention includes a circuit substrate 100b and an electronic component 130 bonded to each other, and an underfill 140b formed between the circuit substrate 110b and the electronic component 130, wherein the circuit substrate 110b includes a base substrate 112 having external circuit wirings 114, first insulating patterns 128 covering the base substrate 112 so that the external circuit wirings 114 are exposed, and second insulating patterns 124 covering the first insulating patterns 128.

The first insulating pattern 128 may include a trench 128b surrounding the electronic component 130 and having a step structure in which its depth becomes deeper as being far from the first region a. In other words, the trench 128b may have a step structure in which its depth gradually becomes deeper as being closer to the second region b, as compared to the trench 122b described with reference to FIG. 1.

Meanwhile, the first insulating pattern 128 having the trench 128b may be formed by performing a predetermined laser or drilling process. As an example, the forming the first insulating pattern 128 may include forming a first resist film covering the base substrate 112, and sequentially performing a laser or drilling process in which the etch rate becomes larger as being far from the first region a, on the region in which the trench 128b of the first resist film is formed. To this end, the laser or drilling processes having different etch rates may be performed on the first resist film at least two times. Alternatively, as another example, the trench 128b may be formed by performing photolithography processes having different etch rates on the first resist film in sequence.

The trench 128b having the structure as described above may have a structure in which the underfill forming material is easily introduced during the process of forming the underfill 140b, as compared to the trench 122b described with reference to FIG. 1. That is, the trench 128b has a step structure, such that the underfill forming material introduced into the first region a to be flowed to the second region b may be easily introduced into the trench 128b. Therefore, the semiconductor package 100b allows the underfill forming material to be effectively defined in the first region a, thereby making it possible to prevent voids in the underfill 140b from being generated and precisely form the underfill 140b.

The printed circuit board according to the present invention may include the base substrate including the first region on which the semiconductor chip is mounted and the second regions positioned outside the first region, the first insulating patterns covering the base substrate and including the trenches formed on the second regions, and the second insulating patterns protruding from the first insulating patterns on the second regions. Herein, the trenches of the first insulating patterns and the second insulating patterns may be used as the structure defining the underfill forming material in a preset shape during the process of forming the underfill. Therefore, the printed circuit board according to the present invention includes the first and second insulating patterns defining the shape of the underfill, thereby making it possible to improve reliability in forming the underfill.

The semiconductor package according to the present invention may include the circuit substrate including the first region and the second regions, the solder resist patterns including the first insulating patterns having a step structure on the second regions and the second insulating patterns, and the underfill defined in the first region by the step structure. Therefore, the semiconductor package according to the present invention can precisely form the underfill in the first region, thereby making it possible to improve reliability in forming the underfill.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A printed circuit board, comprising:
   a base substrate including a first region on which a semiconductor chip is mounted and a second region positioned outside the first region;
   first insulating patterns covering the base substrate and including trenches formed in the first insulating patterns and on the second region, the trenches being continuously deeper as they are farther from the first region, and the trenches being upwardly vertical at the deepest ends of the trenches; and
   second insulating patterns protruding from the first insulating patterns outside the trenches and on the second region.

2. The printed circuit board according to claim 1, wherein at least one of the trenches has an inclined structure in which its depth becomes deeper as it is farther from the first region.

3. The printed circuit board according to claim 1, wherein at least one of the trenches has a ring shape surrounding the semiconductor chip.

4. The printed circuit board according to claim 1, wherein the second insulating pattern has a ring shape surrounding at least one of the trenches.

5. The printed circuit board according to claim 1, wherein the first insulating pattern and the second insulating pattern form a solder resist pattern.

6. The printed circuit board according to claim 1, wherein the first insulating pattern is made of a solder resist and the second insulating pattern is made of an epoxy resin.

7. A semiconductor package, comprising:

a semiconductor chip;

a base substrate including a first region on which the semiconductor chip is mounted and a second region positioned outside the first region;

an underfill interposed between the base substrate and the semiconductor chip;

first insulating patterns covering the base substrate and including trenches formed in the first insulating patterns and on the second region, the trenches being continuously deeper as they are farther from the first region, and the trenches being upwardly vertical at the deepest ends of the trenches; and second insulating patterns protruding from the first insulating patterns outside the trenches and on the second region.

8. The semiconductor package according to claim 6, wherein the first insulating pattern and the second insulating pattern form a structure defining the underfill in a preset shape.

9. The semiconductor package according to claim 6, wherein at least one of the trenches has an inclined structure in which its depth becomes deeper as it is farther from the first region.

10. The semiconductor package according to claim 6, wherein at least one of the trenches has a ring shape surrounding the semiconductor chip.

11. The semiconductor package according to claim 6, wherein the second insulating pattern has a ring shape surrounding at least one of the trenches.

12. The semiconductor package according to claim 6, wherein the second insulating pattern has a shape surrounding the side surfaces of the underfill.

13. The semiconductor package according to claim 6, wherein at least one of the trenches is filled by the underfill.

14. The semiconductor package according to claim 11, wherein the underfill exists up to the top of the second insulating patterns.

\* \* \* \* \*

UNITED STATES PATENT AND TRADEMARK OFFICE
CERTIFICATE OF CORRECTION

| | | |
|---|---|---|
| PATENT NO. | : 8,253,034 B2 | Page 1 of 1 |
| APPLICATION NO. | : 12/926337 | |
| DATED | : August 28, 2012 | |
| INVENTOR(S) | : Byoung Chan Kim et al. | |

It is certified that error appears in the above-identified patent and that said Letters Patent is hereby corrected as shown below:

Title Page Col. 1 Item (75) (Inventors), Line 1, Delete "Cheongiu-si" and insert -- Cheongju-si --, therefor.

Title Page Col. 1 Item (75) (Inventors), Line 5, Delete "Cheongiu-si" and insert -- Cheongju-si --, therefor.

In the Claims

Column 9, Line 17, In Claim 8, delete "claim 6," and insert -- claim 7, --, therefor.

Column 10, Line 1, In Claim 9, delete "claim 6," and insert -- claim 7, --, therefor.

Column 10, Line 5, In Claim 10, delete "claim 6," and insert -- claim 7, --, therefor.

Column 10, Line 8, In Claim 11, delete "claim 6," and insert -- claim 7, --, therefor.

Column 10, Line 11, In Claim 12, delete "claim 6," and insert -- claim 7, --, therefor.

Column 10, Line 14, In Claim 13, delete "claim 6," and insert -- claim 7, --, therefor.

Column 10, Line 16, In Claim 14, delete "claim 11," and insert -- claim 13, --, therefor.

Signed and Sealed this
Twenty-fourth Day of September, 2013

Teresa Stanek Rea
*Deputy Director of the United States Patent and Trademark Office*